United States Patent [19]
Gelsing et al.

[11] 3,942,187
[45] Mar. 2, 1976

[54] SEMICONDUCTOR DEVICE WITH MULTI-LAYERED METAL INTERCONNECTIONS

[75] Inventors: Richardus Johannes Henricus Gelsing; Kees van Steensel, both of Eindhoven, Netherlands

[73] Assignee: U.S. Philips Corporation, New York, N.Y.

[22] Filed: Dec. 29, 1969

[21] Appl. No.: 888,504

[30] Foreign Application Priority Data
Jan. 2, 1969  Netherlands ..................... 6900054

[52] U.S. Cl. ..................... 357/71; 357/54; 357/67; 357/68; 357/69
[51] Int. Cl.² ................. H01L 29/52; H01L 29/54
[58] Field of Search ............. 357/54, 67, 68, 69, 71

[56]  References Cited
UNITED STATES PATENTS

| | | |
|---|---|---|
| 3,335,338 | 8/1967 | Lepselter ............................ 317/234 |
| 3,429,029 | 2/1969 | Lanjdon et al ....................... 29/589 |
| 3,430,104 | 2/1969 | Burgess et al ....................... 317/101 |
| 3,436,616 | 4/1969 | Jarrad ................................. 317/234 |
| 3,480,412 | 11/1969 | Duffek, Jr. et al .................. 29/195 |
| 3,495,324 | 2/1970 | Guthrie et al ....................... 29/578 |
| 3,501,681 | 3/1970 | Weir ................................... 317/234 |
| 3,518,506 | 6/1970 | Gates ................................. 317/234 |
| 3,569,796 | 3/1971 | Mulford, Jr ......................... 317/234 |

*Primary Examiner*—William D. Larkins
*Attorney, Agent, or Firm*—Frank R. Trifari; Jack Oisher

[57]  ABSTRACT

Improved metal interconnections for a semiconductor device is described. The interconnections comprise a first metal layer, eg. aluminum, connected to the semiconductor, a second metal layer, eg. gold, for external connection, and a third metal layer interconnecting the first and second metal layers such that the junction areas of interconnection are laterally spaced from one another.

2 Claims, 3 Drawing Figures

INVENTORS
R. J. H. GELSING
K. van STEENSEL
BY
Frank R. Trifari
AGENT

SEMICONDUCTOR DEVICE WITH MULTI-LAYERED METAL INTERCONNECTIONS

The invention relates to a semiconductor device comprising a semiconductor body on one surface of which a conductive track extends which is connected to and insulated from the semiconductor body over at least part of its length by means of an insulated material, said conductive track comprising a first and a second metal layer which are connected together locally with the interposition of a third metal layer, the material of the third metal layer differing from that of the first and that of the second metal layer and forming with said layers a stable low-ohmic junction.

As is known, conductive tracks are frequently used in semiconductor devices for contacting purposes, which tracks extend over a protective insulating layer in which the conductive tracks can be connected, via apertures in the insulating layer, to zones of circuit elements provided in thee semiconductor body. The materials of which the conductive tracks consist must show particular properties. For example, the contacts between the conductive track and the semiconductor body usually must be non-rectifying and must show a low series resistance. Furthermore, the insulating layer must readily adhere to the semiconductor surface while a good adherence between the conductive track and the insulating layer also is an important requirement. Moreover, the material of the conductive track must have a great conductivity while furthermore, for example, the etchability and the suitability for adhering connection conductors, as well as the temperature stability both in connection with the operations to be performed after providing the conductive track and the operating temperatures occurring are of great importance.

In practice the multiplicity of requirements which are imposed upon the material and of which a number have been mentioned above by way of example has resulted in the use of conductive tracks of which various parts are manufactured from different materials. Known is, for example, the construction in which the part of the conductive track which contacts the semiconductor body consists of aluminium, while the contact surfaces for adhering the connection conductors, which often consist of gold, are of gold.

In the case of a conductive track which is constructed in a similar manner from different metals, the additional important requiremeent must be imposed that the junction between the various metals of the conductive track is stable and low-ohmic.

When the various metals of such a composite conductive track contact each other directly, the stability of the junction usually leaves much to be desired. A known example hereof is the junction between aluminum and gold, in which intermetallic compounds are easily formed at the junction and adversely influence the quality of the junction seriously.

In "E.E. The Magazine of Circuit Design Engineering" 16, No. 5, P. 36, it has already been proposed to increase the stability by means of an intermediate layer. In this case the conductive track mainly consists of aluminum which is particularly suitable for the purpose and is furthermore covered with an insulating layer. At the region of the contact surfaces windows are provided in the insulating layer, so that at said region the aluminum is not covered. In these windows first a layer of titanium and then a layer of gold are provided. On these gold contact surfaces gold connection conductors can easily be provided while the gold and the aluminum are separated from each other by the interposition of the titanium, so that the formation of gold-aluminum compounds is counteracted.

It is the object of the invention to provide a semiconductor device having such a composite semiconductor track, in which the two metals of the track are interconnected with the interposition of a third metal. It is based inter alia on the recognition of the fact that the quality of the connection between the first and the second metal in the known composite conductive tracks is not sufficient for all applications and that it can be improved by using, at the area of the connection, a horizontal separation of the two parts of the semiconductor track instead of a vertical separation.

A semiconductor device of the type mentioned in the preamble according to the invention is characterized in that the projection on the semiconductor surface of the junction between the first and the third metal layer and that of the junction between the second and the third metal layer are situated beside each other.

In this manner it is prevented that the first and the second metal layer contact each other directly through pin-holes in the third metal layer. It has been found that particularly stable and low-ohmic junctions are obtained with said lateral separation.

Especially in semiconductor devices in which, for example, one or more semiconductor zones of a circuit element present in the semiconductor body are to be connected to parts of an envelope via connection conductors, the use of composite conductive tracks is often very desirable. The parts in question of the envelope often are of gold or at least are gold-plated, while gold as a material for the conductive track is less suitable inter alia owing to the required ohmic and stable contact with the semiconductor zones. It will be obvious that it is extremely important in this case that a stable junction in a composite semiconductor track can be used which can be obtained in a simple manner. An important embodiment of the semiconductor device according to the invention therefore is characterized in that the semiconductor body comprises two or more regions of opposite conductivity types associated with a circuit element, at least one of the said regions being connected to the first metal layer via an aperture in the insulating material, the second metal layer being provided with a connection conductor.

The surface area of the junction between the second and the third metal layer preferably is small as compared with the overall surface area of the second metal layer.

The invention can furthermore be used advantageously in semiconductor devices having a conductive track which is provided in several layers one above the other, for example, in integrated circuits which have a large number of circuit elements.

A further important embodiment of the semiconductor device according to the invention is characterized in that the surface of the semiconductor body comprises a number of layers of an insulating material, the second metal layer extending substantially entirely on the free surface of the uppermost insulating layer and being connected, via at least one aperture in the uppermost insulating layer, to the third metal layer which is situated substantially entirely between two of the said insulating layers.

In this manner the material of the part of the conductive track which is situated on the uppermost layer can be chosen with a view to the necessary connections to parts of an envelope or to parts of other semiconductor devices, which is of particular importance because the number of connections in semiconductor devices of this type can be very large so that extra high requirements must be imposed upon the reliability of said connections. The metal of the second metal layer can be adapted to the methods to be used for making said connections, for which purpose is to be considered, for example, the use of parts which are reinforced usually by electrodeposition and project above the insulating layer in a direction perpendicular to the semiconductor surface.

In a preferred embodiment of the semiconductor device according to the invention, the conductive track comprises at least one part which is associated with the second metal layer and is thicker than the first metal layer and which projects laterally, i.e. substantially parallel to the semiconductor surface to beyond the semiconductor body.

By such thickened parts it becomes possible, for example, to produce the above-mentioned necessary connections simultaneously in one operation which is of importance from a point of view of manufacture.

The junction between the first and the third metal layer and that between the second and the third metal layer are preferably situated at least for the greater part on the same side of the third metal layer, while in particular stable junctions can be obtained in a simple manner in the case in which the two junctions are situated at least for the greater part on the side of the third metal layer remote from the semiconductor body, the third metal layer extending entirely on an insulating layer situated between the semiconductor surface and the uppermost insulating layer.

As metals for the various metal layers can be used both substantially pure metals and alloys. Aluminum is particularly suitable for the first metal layer, while for the second metal layer are to be considered inter alia copper and in particular gold.

As a material for the third metal layer which preferably is substantially impermeable to the materials of the first and the second metal layer are to be considered especially molybdenum, platinum, nickel, tungsten, and rhodium.

It is to be noted that the properties of the contact between semiconductor zones and the firsst metal layer can be improved, if desirable, by using a suitably chosen surface concentration in the semiconductor zone to be connected, which concentration can be obtained, if desirable, by means of an extra diffusion treatment. The said contact can also be improved by using special materials such as cobalt- and platinum silicide in the contact window.

The adherence between one or more of the metal layers and the adjoining insulating material can be improved if desirable, by using thin adhering layers. For these adhering layers are to be considered, in addition to, for example, aluminium and platinum silicide, in particular the materials titanium, chromium, molybdenum, niobium, cobalt and nickel.

In order that the invention may be readily carried into effect, a few examples thereof will now be described in greater detail, by way of example, with reference to the accompanying drawing in which.

Figure 1:
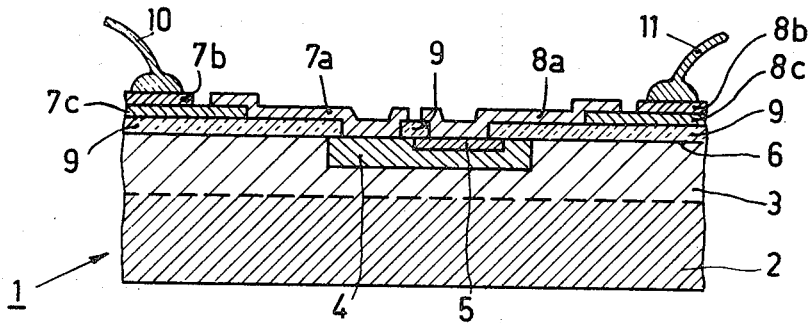
FIG. 1 is a diagrammatic cross-sectional view of a first embodiment of the semiconductor device according to the invention.

As a first embodiment of a semiconductor device according to the invention a transistor will be described. This transistor comprises a semiconductor body 1 (see FIG. 1) which is formed by a substrate 2, on which an epitaxial layer 3 of the same conductivity type as, and having a higher resistivity than, the substrate is provided. The substrate 2 and the layer 3 together constitute the collector of the transistor, a diffused base zone 4 and a diffused emitter zone 5 being provided in the layer 3.

On one surface 6 of the semiconductor body 1 a conductive track (7, 8) extends which for the greater part of its length is secured to and insulated from the semiconductor body 1 by means of insulating material 9. The conductive track consists of two parts 7 and 8 which, via windows in the insulating material 9, serve for the connection of the base zone 4 and the emitter zone 5, respectively, of the transistor. Each of these parts shows a first and a second metal layer which are denoted by 7a, 8a and 7b, 8b, respectively, and which are connected together locally with the interposition of a third metal layer 7c, 8c, the metal of the third metal layer differing from that of the first and that of the second layer and forming with the layers a stable low-ohmic junction.

According to the invention, the projection on the semiconductor surface 6 of the junction between the first metal layer 7a, 8a and the third metal layer 7c, 8c and that of the junction between the second metal layer 7b, 8b and the third metal layer 7c, 8c are situated beside each other.

In this manner a horizontal separation between the first and the second metal layer is obtained as a result of which the metal of the second metal layer 7b, 8b, cannot contact directly the metal of the first metal layer 7a, 8a, not even through pinholes in the third metal layer 7c, 8c and particularly stable low-ohmic junctions are obtained. The junction between the first 7a, 8a and the third 7c, 8c and that between the second 7b, 8b and the third metal layer 7c 8c are situated at least for the greater part on the same side of the third metal layer 7c, 8c.

The second metal layer forms contact surfaces 7b and 8b, to which connection conductors 10 and 11, for example, of gold, can be connected for connecting the base and the emitter of the transistor to, for example, the gold-plated connection pins of a conventional envelope. The collector can be contacted via the substrate.

The transistor shown in FIG. 1 can be manufactured entirely in a manner conventionally used in semiconductor technology. After providing the base and emitter zones a layer of tungsten and then a layer of gold can be provided on the insulating layer 9, which is then closed, by the successive vapour deposition in the same vacuum. By means of conventional photoresist methods, a pattern can then be obtained from said layers to form the second metal layer 7b, 8b of gold and the third metal layer 7c, 8c of tungsten. Finally, windows can be provided in the insulating layer at the area of the emitter and the base zones, after which the first metal layer of, for example aluminum can be provided, from which a pattern can be obtained by etching to form the part 7a and 8a of the conductive track.

The transistor can be mounted in any conventional envelope in which the connection conductors 10 and 11 can be connected to the second metal layer 7b, 8b.

Figure 2:
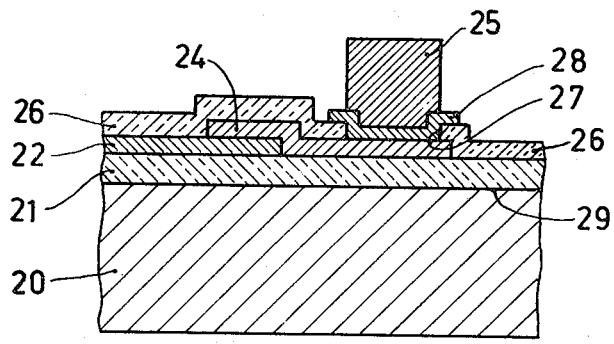
FIG. 2 is a diagrammatic cross-sectional view of a part of a second embodiment of the semiconductor device according to the invention.

In the second embodiment (FIG. 2) the conductive track which is connected to the semiconductor body 20 via the insulating layer 21, comprises a first metal layer 22 which is connected to a second metal layer 25 with the interposition of a third metal layer 24. The first metal layer 22 and a part of the third metal layer 24 are covered with a second insulating layer 26. The second metal layer extends fully on the free surface of the uppermost insulating layer 26 and is connected, via an aperture 27 in said layer 26, to the first metal layer which is situated substantially entirely between the two insulating layers 21 and 26.

The insulating layer 21 consists, for example, of thermal silicon dioxide, or another suitable insulator. On this layer can be provided, for example, a first metal layer 22 of aluminum from which a pattern is obtained by etching and the device can then be provided with a third metal layer of nickel. In order to obtain a good low-ohmic junction between the aluminum and the nickel, it may be necessary to use an after-treatment at a slightly elevated temperature and/or to provide a thin layer of, for example, titanium, aluminum or chromium between the aluminum and the nickel in order to reduce the oxide skin which is usually present on the aluminium.

The assembly may then be covered with the second insulating layer 26, for example, of silicon dioxide, provided via the vapour phase. In this layer a window 27 situated above the nickel may be provided after which the layer 28 of, for example, also nickel can be vapour-deposited. This layer can be locally reinforced by means of a mask consisting of a layer of photo-lacquer by electrodeposition, a second metal layer 25, for example, of copper being provided. The nickel layer 28 can be used as the electrode during the reinforcement by electrodeposition and then a pattern may be obtained from said layer. Furthermore, the adherence of the copper layer to the insulating layer 26 is considerably improved by using the nickel layer 28.

The reinforced parts 25 projecting above the insulating layer 26 enable the provision of the device on an insulating substrate which comprises conductive tracks, the surface 29 of the semiconductor body on which insulating material is present facing the said substrate. The parts 25 can be tin-plated and soldered in any conventional manner.

It is to be noted that, although the reinforced second metal layer 25 in the present example is provided at the area of the window 27, it may also extend further over the insulating layer 26, in which case the layer 25 preferably shows only local reinforcements for mounting the device.

Figure 3:
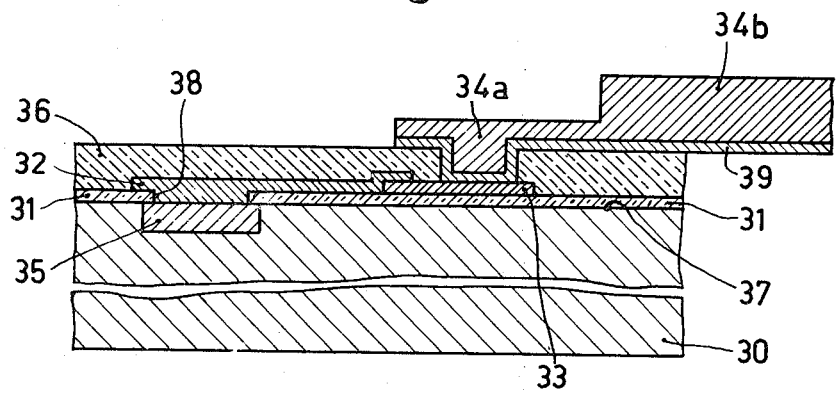
FIG. 3 is a diagrammatic cross-sectional view of a part of a third embodiment of the semiconductor device according to the invention.

A third example, a part of which is shown in FIG. 3, comprises a semiconductor body 30 having an insulating layer 31 on which the first metal layer 32 of, for example, aluminum is present. The part 32 of the conductive track 32 to 34 serves for contacting and possible throughconnection of semiconductor zones of circuit elements arranged in the semiconductor body 30, of which zones only one is shown for reasons of clarity, namely the zone 35.

The metal layer 32 adjoins, and forms a junction with, a third metal layer 33 which can have comparatively small dimensions.

The metal layers 32 and 33 are covered with a second insulating layer 36, in which a window is present at the area of the metal layer 33, so that the second metal layer 34 situated substantially entirely on the free surface is connected to the third metal layer 33.

The two junctions between the first and the second metal layer on the one hand and the third metal layer on the other hand are situated at least for the greater part on the side of the third metal layer 33, remote from the semiconductor body 30, said layer 33 extending entirely on the insulating layer 31 situated between the semiconductor surface 37 and the uppermost insulating layer 36. In this manner the fact may be used that the third metal layer 33 often is less apt to form an oxide skin than the first metal layer 32. If in that case the third metal layer is first provided and then the first metal layer, substantially no oxide will be present on the junction between said layers so that the formation of a low-ohmic junction is facilitated.

Furthermore, the surface area of the junction between the second metal layer 34a, b and the third metal layer 33 is small relative to the overall surface area of the second metal layer, while the second metal layer 34 is at least locally thicker, namely at 34b than the first metal layer 32 and projects laterally to beyond the semiconductor body 30.

Both substantially pure metals and alloys may be used for the metal layers. In the present embodiment the first metal layer consists substantially entirely of aluminum and is, for example, approximately 1 $\mu$m thick. The second metal layer consists, for example, substantially entirely of gold in which at least the projecting reinforced parts 34b may have a thickness of approximately 10 $\mu$m. In so far as the second metal layer is not reinforced, as the part 34a, and is used also, for example, for the interconnection of circuit elements, the thickness is, for example, approximately 1 $\mu$m.

The third metal layer which preferably is substantially impermeable to the materials of the first and the second metal layer preferably consists of one of the metals platinum, nickel, tungsten, and rhodium, or, as in the present embodiment, of molybdenum. The thickness is, for example, approximately 0.4 $\mu$m and the lateral dimensions are, for example, approximately 35 $\mu$m × 35 $\mu$m.

In order to improve the ohmic contact between the first metal layer 32 and the semiconductor 34, materials may be used in the window, for example, platinum silicide, and cobalt silicide, which materials provide a very stable and low-ohmic contact, for example, after alloying. A contact diffusion may also be performed.

The adherence between the metal layers and the insulating material may be improved, if desirable, by using a thin layer of preferably titanium, chromium, molybdenum, niobium, cobalt or nickel. In the present embodiment, for example, a thin layer 39 of titanium having a thickness of approximately 0.05 $\mu$m is used between the gold layer 34a, b and the insulating layer 36.

The above-described embodiment can also be manufactured entirely in a manner conventionally used in semiconductor technology. The aluminum layer 32 can be vapour-deposited, for example, or be obtained by RF sputtering, after which the excessive aluminum can be removed with conventional photoresist methods. The molybdenum layer 33 can be provided in a corresponding manner, for example, by means of RF or triode sputtering. The titanium layer 39 can be vapour-deposited and the gold layer 34 can be provided, for example, by vapour deposition and/or by electrodeposition. The second insulating layer 36 can be provided, for example, by sputtering, the thickness preferably lying between 1 and 2 a$\mu$m.

The semiconductor material below the projecting parts 34 b can then be removed in any conventional manner in which, for example, a large number of devices which are manufactured in the same semiconductor wafer, can be severed simultenaously from each other by dividing said semiconductor plate.

It will be obvious that the invention is not restricted to the embodiments described but that many variations are possible to those skilled in the art without departing from the scope of the present invention. For example, the semiconductor body which usually consists of silicon, but may be also, for example, of germanium or an $A_{III}B_V$ compound, may comprise, in addition to bipolar transistors, other circuit elements, for example, field effect transistors, diodes, resistors and capacitances. The invention furthermore relates both to single circuit elements and to more complex devices, for example, integrated circuits. In particular, the last two examples may be used both in devices in which the conductive track is provided at least mainly at one level, the level of the first metal layer, and in devices in which the conductive track is divided over two or more levels, for example, in connection with the complexity and the number of circuit elements of the device. Due to the presence of the second insulating layer 26, 36, for example, a second level for the conductive track is already present in which the conductive track on said second or uppermost level may consist fully or partly of the same material as the second metal layer.

As an insulating material may be used, in addition to silicon dioxide, for example, also silicon nitride, aluminum oxide, or combinations of insulating materials, in which in the latter case the semiconductor track can, for example, be oxidized partly.

What is claimed is:

1. A semiconductor device comprising a semiconductor body having a surface, plural layers of insulating material over the surface of the semiconductor body and including a first insulating layer on said semiconductor surface, a first metal layer on said first insulating layer over at least part of its length and connected to a region of said semiconductor body at the surface, a second metal layer over said first insulating layer and laterally extending with respect to said first metal layer, and a third metal layer over said first insulating layer and connected to both said first and second metal layers, the second metal layer extending substantially entirely on the free surface of the uppermost insulating layer and being connected via at least one aperture in the uppermost insulating layer to the third metal layer, the third metal layer being situated substantially entirely between two of said insulating layers, the metal of the third metal layer being different from the metal of the first and second metal layers and forming with the latter where connected stable low-ohmic junction areas, the third metal layer being located relative to the first and second metal layers such that the projections onto the body surface of the junction areas where the third metal layer connects to the first and second metal layers are laterally spaced from one another whereby said junction areas are in non-overlying relationship.

2. A semiconductor device as claimed in claim 1 wherein the two junction areas are situated at least for the greater part on the side of the third metal layer remote from the semiconductor body, and the third metal layer extends entirely on an insulating layer situated between the semiconductor surface and the uppermost insulating layer.

* * * * *